United States Patent
Kumakura et al.

(10) Patent No.: US 10,483,118 B2
(45) Date of Patent: Nov. 19, 2019

(54) ETCHING METHOD

(71) Applicant: Tokyo Electron Limited, Tokyo (JP)

(72) Inventors: Sho Kumakura, Miyagi (JP); Masahiro Tabata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/975,852

(22) Filed: May 10, 2018

(65) Prior Publication Data
US 2018/0330958 A1    Nov. 15, 2018

(30) Foreign Application Priority Data

May 11, 2017 (JP) .................................. 2017-094726
Mar. 12, 2018 (JP) .................................. 2018-044678

(51) Int. Cl.
*H01L 21/3065* (2006.01)
*H01L 21/67* (2006.01)
(Continued)

(52) U.S. Cl.
CPC ...... *H01L 21/3065* (2013.01); *H01L 21/0337* (2013.01); *H01L 21/0475* (2013.01);
(Continued)

(58) Field of Classification Search
CPC .. H01J 37/00; H01L 21/0337; H01L 21/0475; H01L 21/3065; H01L 21/3116;
(Continued)

(56) References Cited

U.S. PATENT DOCUMENTS

2007/0117341 A1* 5/2007 Smith ...................... G03F 7/427
                                                    438/400
2014/0209026 A1* 7/2014 LaVoie .............. H01L 21/02164
                                                    118/723 R
(Continued)

FOREIGN PATENT DOCUMENTS

JP    H07-193044 A    7/1995
JP    H11-072606 A    3/1999

OTHER PUBLICATIONS

Wolf, et al., "Reactive Ion Etching of 6H—SiC in SF6/O2 and CF4/O2 with N2 Additive for Device Fabrication", J. Electrochem. Soc., vol. 143, No. 3, Mar. 1996, pp. 1037-1042.

*Primary Examiner* — Lan Vinh
(74) *Attorney, Agent, or Firm* — Pearne & Gordon LLP

(57) ABSTRACT

A selectivity can be improved in a desirable manner when etching a processing target object containing silicon carbide. An etching method of processing the processing target object, having a first region containing silicon carbide and a second region containing silicon nitride and in contact with the first region, includes etching the first region to remove the first region atomic layer by atomic layer by repeating a sequence comprising: generating plasma from a first gas containing nitrogen to form a mixed layer containing ions contained in the plasma generated from the first gas in an atomic layer of an exposed surface of the first region; and generating plasma from a second gas containing fluorine to remove the mixed layer by radicals contained in the plasma generated from the second gas.

13 Claims, 7 Drawing Sheets

(51) Int. Cl.
    *H01L 21/311*     (2006.01)
    *H01L 21/04*     (2006.01)
    *H01L 37/00*     (2006.01)
    *H01L 21/683*     (2006.01)
    *H01L 21/033*     (2006.01)
    *H01L 29/16*     (2006.01)

(52) U.S. Cl.
CPC .. *H01L 21/31116* (2013.01); *H01L 21/67069* (2013.01); *H01L 21/67103* (2013.01); *H01L 21/67109* (2013.01); *H01L 21/6831* (2013.01); *H01L 37/00* (2013.01); *H01L 29/1608* (2013.01)

(58) Field of Classification Search
CPC ......... H01L 21/67069; H01L 21/67103; H01L 21/67109; H01L 21/6831; H01L 29/1608
USPC ....... 438/706, 710, 712, 714, 717, 723, 750; 216/67, 72, 74, 78, 79
See application file for complete search history.

(56) References Cited

U.S. PATENT DOCUMENTS

2016/0163558 A1*   6/2016   Hudson ............. H01L 21/30655
                                                            438/696
2016/0293398 A1*  10/2016   Danek ................. H01L 21/0228

* cited by examiner

ETCHING METHOD

CROSS-REFERENCE TO RELATED APPLICATION

This application claims the benefit of Japanese Patent Application Nos. 2017-094726 and 2018-044678 filed on May 11, 2017 and Mar. 12, 2018, respectively, the entire disclosures of which are incorporated herein by reference.

TECHNICAL FIELD

The embodiments described herein pertain generally to an etching method upon a processing target object.

BACKGROUND

A plasma etching is known as one kind of a plasma processing performed upon a processing target object by using a plasma processing apparatus. A resist mask used in the plasma etching is formed by a photolithography technique, and a limit size of a pattern formed on an etching target layer depends on a resolution of the resist mask formed by the photolithography technique. However, there is a limit in the resolution of the resist mask. As a demand for high integration of electronic devices is getting higher, it is required to form the pattern having a size smaller than the resolution limit of the resist mask. By way of example, techniques regarding etching upon a processing target object made of SiC (silicon carbide) are described in Patent Documents 1 and 2 and Non-Patent Document 1. Patent Document 1 discloses an etching method of performing reactive ion beam etching upon SiC by using a mixed gas of $CCl_2F_2$ and Ar. Patent Document 2 describes a method of etching SiC by using a gas containing a $SF_6$ gas. Further, Non-patent Document 1 discloses a technique of etching SiC by using a mixed gas containing a $CF_4$ gas, a $SF_6$ gas and a $N_2$ gas.

Patent Document 1: Japanese Patent Laid-open Publication No. H07-193044

Patent Document 2: Japanese Patent Laid-open Publication No. H11-072606

Non-patent Document 1: "Reactive Ion Etching of 6H-SiC in $SF_6/O_2$ and $CF_4/O_2$ with $N_2$ Additive for Device Fabrication," R. Wolf and R. Helbig, J. Electrochem. Soc., Vol. 143, No. 3, March 1996

SUMMARY

Meanwhile, as the electronic devices are miniaturized to meet the recent trend of the high integration, it is required to control a critical dimension (CD) with high accuracy when forming the pattern on the processing target object. In case of forming a fine slit vertically on a SiC layer, a $Cl_2$-based gas or a HBr-based gas may be used to obtain a selectivity against the mask. However, a metal portion may be corroded by the $Cl_2$-based gas or the HBr-based gas. In case of using a $NF_3$-based gas, though the corrosion of the metal portion can be suppressed, the selectivity is degraded. Further, there may be a case where the selectivity against the mask is obtained by using a gas containing carbon having deposition property. In such a case, however, a deposit generated from the carbon-containing gas may cause clogging of an opening of the fine slit. In this regard, there is a demand for a technique capable of improving the selectivity in a desirable manner when etching the processing target object containing silicon carbide.

In an exemplary embodiment, there is provided an etching method of etching a processing target object. The processing target object has a first region and a second region in contact with the first region. The etching method includes etching the first region to remove the first region atomic layer by atomic layer by repeating a sequence comprising: a first process of generating plasma from a first gas within a processing vessel of a plasma processing apparatus in which the processing target object is accommodated to form a mixed layer containing ions contained in the plasma generated from the first gas in an atomic layer of an exposed surface of the first region; a second process of purging a space within the processing vessel after performing the first process; a third process of generating, after performing the second process, plasma from a second gas within the processing vessel to remove the mixed layer by radicals contained in the plasma generated from the second gas; and a fourth process of purging the space within the processing vessel after performing the third process. The first region contains silicon carbide, and the second region contains silicon nitride. The first gas contains nitrogen, and the second gas contains fluorine.

According to the method, the exposed surface of the first region containing the silicon carbide (SiC) can be formed and confined by the second region as the second region containing the silicon nitride (SiN) is provided to be in contact with the first region. In the first process of the sequence performed repeatedly, the mixed layer containing nitrogen ions is formed in the exposed surface of the first region containing the silicon carbide by the plasma generated from the first gas containing the nitrogen. Then, in the third process of the sequence, the mixed layer formed through the first process is removed by using the radicals contained in the plasma generated from the fluorine-containing second gas, while the etching upon the second region containing the silicon nitride is sufficiently suppressed. As stated, the mixed layer is formed to conform to the plane shape of the exposed surface of the first region in the first process using the first gas containing the nitrogen, and only the mixed layer is removed from the first region in the third process using the second gas containing the fluorine. Accordingly, the etching upon the first region is enabled in the state that the plane shape of the exposed surface of the first region is maintained precisely while avoiding the etching on the second region and the formation of the deposit on the side surface of the second region located above the exposed surface of the first region. Thus, regardless of the plane shape of the exposed surface of the first region, the etching upon the first region can be performed in a uniform manner. Further, as the sequence including these first and third processes is repeated, the etching upon the first region can be performed up to a required depth in a uniform manner regardless of the plane shape of the exposed surface of the first region, in the stat that the plane shape of the exposed surface of the first region is precisely maintained. In addition, since neither the first gas nor the second gas is a $Cl_2$-based gas or a HBr-based gas, the corrosion of the metal portion can be avoided.

In the first process, the mixed layer containing the ions may be formed in the atomic layer of the exposed surface of the first region by applying a bias voltage to the plasma generated from the first gas. Since the bias voltage is applied to the plasma generated from the first gas, the ions (ions of the nitrogen atoms) contained in the corresponding plasma may be anisotropically supplied to the exposed surface of the first region. Therefore, the mixed layer formed in the exposed surface of the first region may have a shape highly conforming to the plane shape of the exposed surface of the first region, when viewed from above the exposed surface of the first region.

The first gas may be a $N_2$ gas or a mixed gas containing a $N_2$ gas and an $O_2$ gas. In this way, the first gas containing the nitrogen can be achieved.

The second gas may be a mixed gas containing a $NF_3$ gas, a $H_2$ gas, an $O_2$ gas and an Ar gas. In this way, the second gas containing the fluorine can be achieved.

In another exemplary embodiment, there is provided an etching method of etching a processing target object within a processing vessel. The processing target object has a first region containing SiC and a second region containing Ti, TiN, $TiO_x$, W, WC, Hf, $HfO_x$, Zr, $ZrO_x$, Ta, $SiO_2$, Si, SiGe, Ge, or Ru (x is an integer). The etching method includes removing the first region by repeating a sequence comprising: forming, by generating plasma from a first gas containing nitrogen, a mixed layer containing ions contained in the plasma generated from the first gas in the first region; and removing the mixed layer by generating plasma from a second gas containing fluorine within the processing vessel after the forming of the mixed layer.

The etching method may further include purging a space within the processing vessel between the forming of the mixed layer and the removing of the mixed layer or after the removing of the mixed layer.

The first gas may contain at least one of a $N_2$ gas, a $NH_3$ gas, a NO gas and a $NO_2$ gas, and the second gas may contain at least one of a $NF_3$ gas, a $SF_6$ gas and a $CF_4$ gas.

The first gas may further contain at least one of an $O_2$ gas, a $CO_2$ gas, a CO gas, a NO gas and a $NO_2$ gas.

The second gas may further contain at least one of a $H_2$ gas, a $D_2$ gas, a $NH_3$ gas, an $O_2$ gas, a $CO_2$ gas, a CO gas, a NO gas and a $NO_2$ gas.

In yet another exemplary embodiment, there is provided an etching method. The etching method includes preparing a processing target object having a first region containing silicon and a second region different from the first region; forming a layer containing nitrogen on the first region by exposing the processing target object to nitrogen plasma; and removing, after the forming of the layer, the layer containing the nitrogen by exposing the processing target object to fluorine plasma. The first region is removed by repeating the forming of the layer and the removing of the layer.

According to the exemplary embodiments as described above, it is possible to provide the technique capable of improving the selectivity in a desirable manner when etching the processing target object containing silicon carbide.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
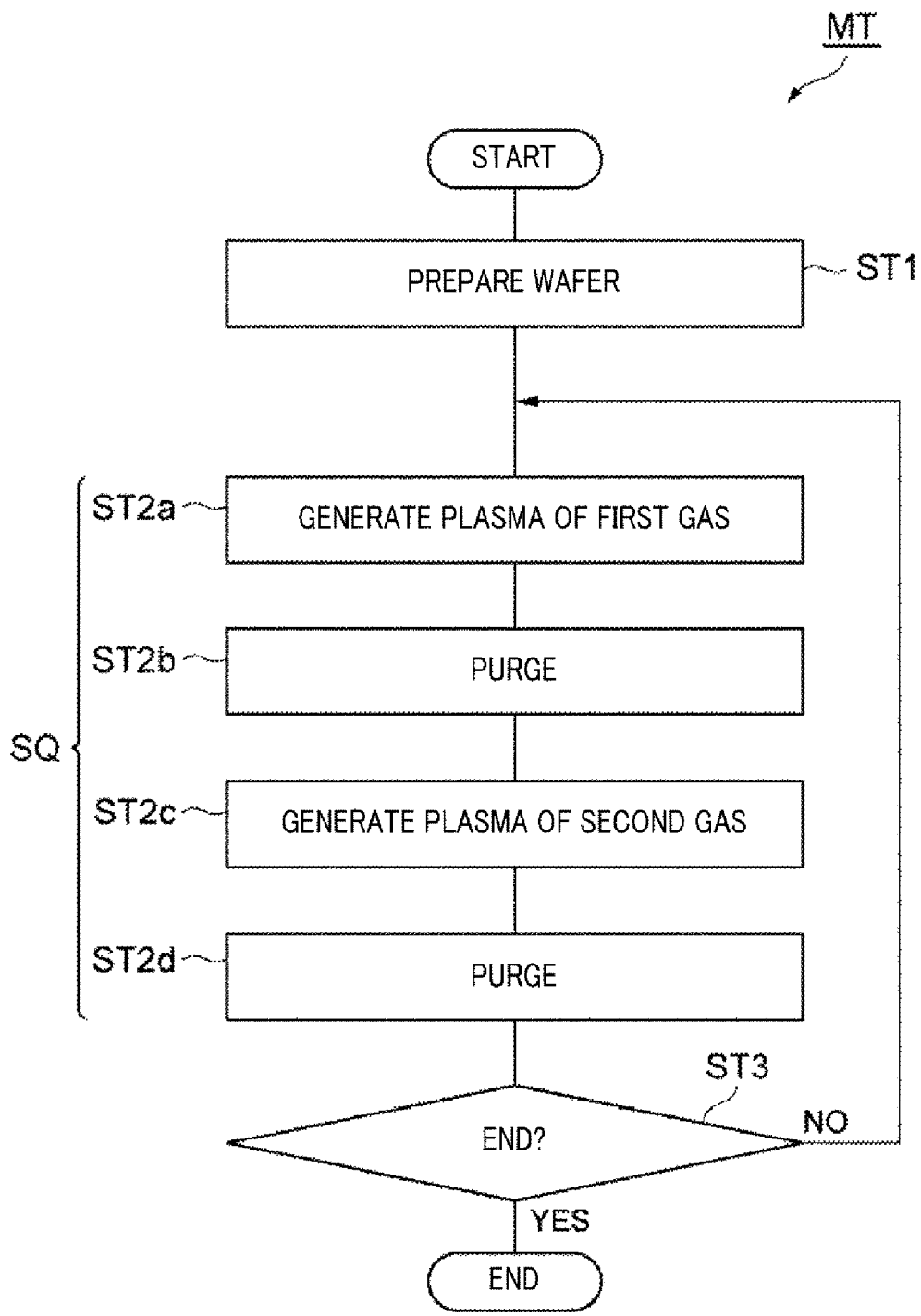
FIG. 1 is a flowchart for describing a method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. Same or corresponding parts in the various drawings will be assigned same reference numerals. Below, referring to FIG. 1, an etching method (method MT) that can be performed by using a plasma processing apparatus 10 will be explained. FIG. 1 is a flowchart for describing the method (method MT) according to an exemplary embodiment. The method MT according to the exemplary embodiment shown in FIG. 1 is a method of processing a processing target object (hereinafter, sometimes referred to as "wafer"). The method MT is an example of etching the wafer. In the method MT according to the exemplary embodiment, a series of processes can be performed in a single plasma processing apparatus (for example, the plasma processing apparatus 10 shown in FIG. 2).

Figure 2:
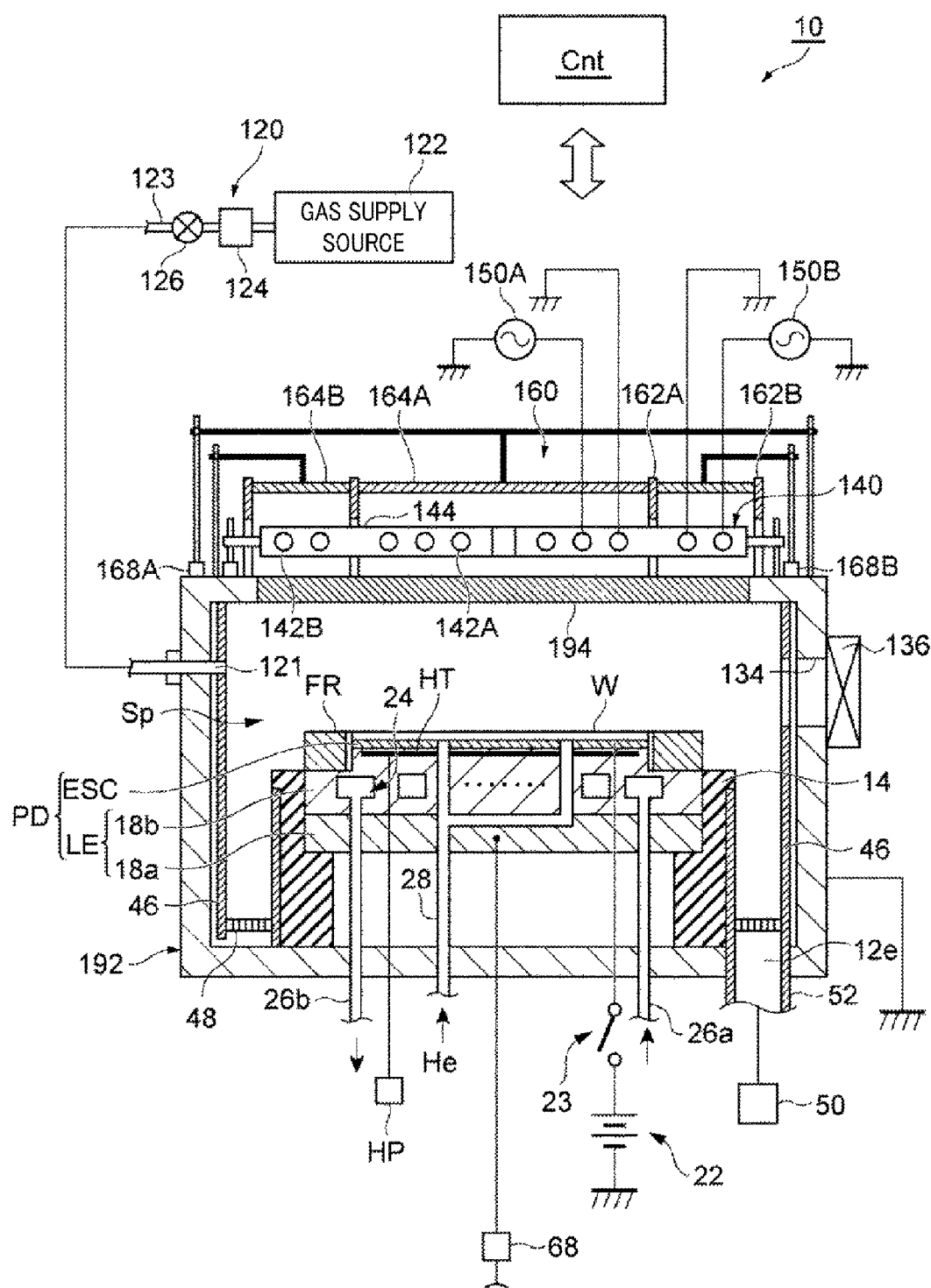
FIG. 2 is a diagram illustrating an example of a plasma processing apparatus.

FIG. 2 is a schematic diagram illustrating the plasma processing apparatus 10 according to the exemplary embodiment. The plasma processing apparatus 10 shown in FIG. 2 is equipped with an inductively coupled plasma (ICP) type plasma source. The plasma processing apparatus 10 includes a processing vessel 192 made of a metal (for example, aluminum) and having a barrel shape (for example, a cylindrical shape). The processing vessel 192 has therein a processing space Sp in which a plasma processing is performed. Further, the shape of the processing vessel 192 is not limited to the cylindrical shape. By way of example, the processing vessel 192 may have a rectangular cylindrical shape (for example, a box shape). Further, the plasma source of the plasma processing apparatus 10 is not limited to the ICP type but may be of various types such as an electron cyclotron resonance (ECR) type or a CCP type or one using a microwave.

A placing table PD for mounting a wafer W thereon is provided at a bottom of the processing vessel 192. The placing table PD includes an electrostatic chuck ESC and a lower electrode LE. The lower electrode LE includes a first plate 18*a* and a second plate 18*b*. The processing vessel 192 has the processing space Sp formed therein.

Within the processing vessel 192, a supporting member 14 is provided on the bottom of the processing vessel 192. The supporting member 14 has, for example, a substantially cylindrical shape. The supporting member 14 is made of, by way of example, but not limitation, an insulating material. The insulating material forming the supporting member 14 may contain oxygen such as quartz. The supporting member 14 is vertically extended from the bottom of the processing vessel 192 within the processing vessel 192.

The placing table PD is provided within the processing vessel 192. The placing table PD is supported by the supporting member 14. The placing table PD holds the wafer W on a top surface thereof. The wafer W is a processing target object. The placing table PD includes the lower electrode LE and the electrostatic chuck ESC.

The lower electrode LE includes the first plate 18*a* and the second plate 18*b*. The first plate 18*a* and the second plate 18*b* are made of a metal such as, but not limited to, aluminum. The first plate 18*a* and the second plate 18*b* may have, for example, a substantially circular plate shape. The second plate 18*b* is provided on the first plate 18*a*. The second plate 18*b* is electrically connected with the first plate 18*a*.

The electrostatic chuck ESC is provided on the second plate 18*b*. The electrostatic chuck ESC has a structure in which an electrode of conductive film is embedded between a pair of insulating layers or insulating sheets. The electrode of the electrostatic chuck ESC is electrically connected to a DC power supply 22 via a switch 23. The electrostatic chuck 16 is configured to attract the wafer W by the electrostatic force generated by a DC voltage applied from the DC power supply 22. Accordingly, the electrostatic chuck ESC is capable of holding the wafer W.

A focus ring FR is placed on a peripheral portion of the second plate 18*b* to surround an edge of the wafer W and the electrostatic chuck ESC. The focus ring FR is configured to improve etching uniformity. The focus ring FR is made of a material which is appropriately selected based on a material of an etching target film. By way of non-limiting example, the focus ring FR may be made of quartz.

A coolant path 24 is provided within the second plate 18*b*. The coolant path 24 constitutes a temperature control mechanism. A coolant is supplied into the coolant path 24 from a chiller unit provided outside the processing vessel 192 via a pipeline 26*a*. The coolant supplied into the coolant path 24 is then returned back into the chiller unit via a pipeline 26*b*. In this way, the coolant is supplied into the coolant path 24 to be circulated therein. A temperature of the wafer W held by the electrostatic chuck ESC is controlled by adjusting a temperature of the coolant. Through a gas supply line 28, a heat transfer gas, e.g., a He gas, from a heat transfer gas supply device is supplied into a gap between a top surface of the electrostatic chuck ESC and a rear surface of the wafer W.

A heater HT is a heating device. By way of example, the heater HT is buried in the second plate 18*b*. The heater HT is connected to a heater power supply HP. As a power is supplied to the heater HT from the heater power supply HP, the temperature of the placing table PD is adjusted, so that the temperature of the wafer W placed on the placing table PD is adjusted. Further, the heater HT may be embedded in the electrostatic chuck ESC.

A plate-shaped dielectric member 194 is provided above the placing table PD, facing the placing table PD. The lower electrode LE and the plate-shaped dielectric member 194 are disposed to be substantially parallel to each other. The processing space Sp is provided between the plate-shaped dielectric member 194 and the lower electrode LE. The processing space Sp is a space in which the plasma processing is performed on the wafer W.

In the plasma processing apparatus 10, a deposition shield 46 is provided along an inner wall of the processing vessel 192 in a detachable manner. The deposition shield 46 is also provided on an outer side surface of the supporting member 14. The deposition shield 46 is configured to suppress an etching byproduct (deposit) from adhering to the processing vessel 192, and is formed by coating an aluminum member with $Y_2O_3$ or the like. Besides the $Y_2O_3$, the deposition shield may be made of an oxygen-containing material such as, but not limited to, quartz.

At a bottom side of the processing vessel 192, a gas exhaust plate 48 is provided between the supporting member 14 and a sidewall of the processing vessel 192. The gas exhaust plate 48 may be made of, by way of example, an aluminum member coated with ceramic such as $Y_2O_3$ or the like. A gas exhaust opening 12*e* is formed at the processing vessel 192 under the gas exhaust plate 48. The gas exhaust opening 12*e* is connected with a gas exhaust device 50 via a gas exhaust line 52. The gas exhaust device 50 includes a vacuum pump such as a turbo molecular pump, and is capable of decompressing the space within the processing vessel 192 to a required vacuum level. A high frequency power supply 64 is configured to generate a high frequency power for ion attraction into the wafer W, that is, a high frequency bias power. By way of example, the high frequency power supply 64 generates the high frequency bias power having a frequency ranging from 400 kHz to 40.68 MHz, for example, 13 MHz. The high frequency power supply 64 is connected to the lower electrode LE via a matching device 68. The matching device 68 is a circuit configured to match an output impedance of the high frequency power supply 64 and an input impedance at a load side (lower electrode LE side).

The plate-shaped dielectric member 194 provided at the ceiling of the processing vessel 192 is made of, by way of example, quartz glass or ceramic, and is disposed to face the placing table PD. To elaborate, the plate-shaped dielectric member 194 is formed to have, for example, a circulate plate shape, and is hermetically mounted to the ceiling of the processing vessel 192 to close an opening formed thereat. The processing space Sp is a space in which plasma is generated by the plasma source. Further, the processing space Sp is a space in which the wafer W is placed.

The processing vessel 192 is provided with a gas supply unit 120 configured to supply a first gas and a second gas to be described later. The gas supply unit 120 supplies the first gas and the second gas into the aforementioned processing space Sp. A gas inlet opening 121 is formed at the sidewall of the processing vessel 192. The gas inlet opening 121 is connected with a gas supply source 122 via a gas supply line 123. Flow rate control devices (for example, mass flow controllers 124 and opening/closing valves 126) configured to control flow rates of the first gas and the second gas are provided at a portion of the gas supply line 123. With this gas supply unit 120, the first gas and the second gas supplied from the gas supply source 122 are supplied into the processing space Sp of the processing vessel 192 from the gas inlet opening 121 after being controlled to have preset flow rates by the mass flow controllers 124.

Further, in FIG. 2, though the gas supply unit 120 is illustrated to have a single-system gas line for the simplicity of illustration, the gas supply unit 120 is configured to supply multiple kinds of gases (at least the first gas and the second gas). That is, the gas supply unit 120 has a pipeline configuration in which the first gas and the second gas are not mixed. Further, though the gas supply unit 120 in FIG. 2 is shown to have a configuration in which the gases are supplied from the sidewall of the processing vessel 192, the gas supply unit 120 is not merely limited to this example shown in FIG. 2. By way of example, the gas supply unit 120 may be configured to supply the gases from the ceiling of the processing vessel 192. In case that the gas supply unit 120 has the above-described configuration, a gas inlet opening may be formed at, for example, a central portion of the plate-shaped dielectric member 194, and the gases may be supplied from this gas inlet opening.

The gas exhaust device 50 configured to exhaust an atmosphere within the processing vessel 192 is connected to the bottom of the processing vessel 192 via the gas exhaust line 52. The gas exhaust device 50 may be implemented by, by way of example, but not limitation, a vacuum pump, and may set an internal pressure of the processing vessel 192 to a preset pressure.

A wafer carry-in/out opening 134 is provided at the sidewall of the processing vessel 192, and a gate valve 136 is provided at the wafer carry-in/out opening 134. For example, when the wafer W is carried in, the gate valve 136 is opened. Then, after the wafer W is placed on the placing table PD within the processing vessel 192 by a non-illustrated transfer mechanism such as a transfer arm, the gate valve 136 is closed, and the processing on the wafer W is begun.

At an upper side (outside) of the plate-shaped dielectric member 194, a planar high frequency antenna 140 and a shield member 160 configured to cover the high frequency antenna 140 are provided at the ceiling of the processing vessel 192. In the exemplary embodiment, the high frequency antenna 140 includes an inner antenna element 142A provided at a central portion of the plate-shaped dielectric member 194 and an outer antenna element 142B disposed to surround the inner antenna element 142A. Each of the inner antenna element 142A and the outer antenna element 142B is made of a conductor such as, but not limited to, copper, aluminum or stainless steel, and has a spiral coil shape.

The inner antenna element 142A and the outer antenna element 142B are configured as a single body by being supported by a plurality of supporting bodies 144. For example, each of the supporting bodies 144 has a rod shape. These supporting bodies 144 are arranged in a radial shape to be protruded from a central portion of the inner antenna element 142A toward an outside of the outer antenna element 142B.

The shield member 160 includes an inner shield wall 162A and an outer shield wall 162B. The inner shield wall 162A is provided between the inner antenna element 142A and the outer antenna element 142B to surround the inner antenna element 142A. The outer shield wall 162B is disposed to surround the outer antenna element 142B, and has a cylindrical shape. Accordingly, a top surface of the plate-shaped dielectric member 194 is divided into a central region (central zone) inside the inner shield wall 162A and a peripheral region (peripheral zone) between the inner shield wall 162A and the outer shield wall 162B.

A circular plate-shaped inner shield plate 164A is placed above the inner antenna element 142A to close an opening of the inner shield wall 162A. An annular plate-shaped outer shield plate 164B is provided above the outer antenna element 142B to close an opening between the inner shield wall 162A and the outer shield wall 162B.

The shape of the shield member 160 may not be limited to the cylindrical shape. The shield member 160 may be of another shape such as, but not limited to, a rectangular cylindrical shape, or may have a shape conforming to the shape of the processing vessel 192. Here, since the processing vessel 192 has the substantially circular cylindrical shape, for example, the shield member 160 has a substantially circular cylindrical shape conforming to the circular cylindrical shape of the processing vessel 192. In case that the processing vessel 192 has the substantially rectangular cylindrical shape, the shield member 160 also has a substantially rectangular cylindrical shape.

The inner antenna element 142A is connected to a high frequency power supply 150A, and the outer antenna element 142B is connected to a high frequency power supply 150B. Accordingly, high frequency powers having the same or different frequencies are supplied to the inner antenna element 142A and the outer antenna element 142B. By way of example, if the high frequency power having a frequency of, e.g., 27 MHz is supplied to the inner antenna element 142A at a preset power [W] from the high frequency power supply 150A, an induction field is generated within the processing vessel 192, so that a gas introduced in the processing vessel 192 is excited by the induction field. As a result, ring-shaped plasma is generated above a central portion of the wafer W. Further, if the high frequency power having a frequency of, e.g., 27 MHz is supplied from the high frequency power supply 150B to the outer antenna element 142B at a preset power [W], an induction field is generated within the processing vessel 192, so that the gas introduced in the processing vessel 192 is excited by this induction field. Accordingly, another ring-shaped plasma is generated above a peripheral portion of the wafer W. The high frequency powers output from the high frequency power supplies 150A and 150B are not limited to the aforementioned frequencies, and high frequency powers of various frequencies may be supplied from the high frequency power supplies 150A and 150B. Further, electrical lengths of the inner antenna element 142A and the outer antenna element 142B need to be adjusted depending on the high frequency powers respectively output from the high frequency power supplies 150A and 150B. For the purpose, heights of the inner shield plate 164A and the outer shield plate 164B are individually adjusted by an actuator 168A and an actuator 168B, respectively.

A control unit Cnt is implemented by a computer including a processor, a storage unit, an input device, a display device, and so forth, and is configured to control individual components of the plasma processing apparatus 10. To elaborate, the control unit Cnt is connected to the mass flow controller 124, the opening/closing valve 126, the gas exhaust device 50, the high frequency power supply 150A, the high frequency power supply 150B, the high frequency power supply 64, the matching device 68, the heater power supply HP and the chiller unit.

The control unit Cnt is operated to output control signals according to a program based on an input recipe. The selection of the gas supplied from the gas supply source 122 and the flow rate of the selected gas, the gas exhaust of the gas exhaust device 50, the power supplies from the high frequency power supplies 150A, 150B and 64, the power supply from the heater power supply HP, the control of the flow rate and the temperature of the coolant from the chiller unit can be achieved in response to the control signals from the control unit Cnt. Further, individual processes of the etching method (the method MT shown in FIG. 1) upon the processing target object according to the present exemplary embodiment can be performed as the individual components of the plasma processing apparatus 10 are operated under the control of the control unit Cnt.

Figure 4:
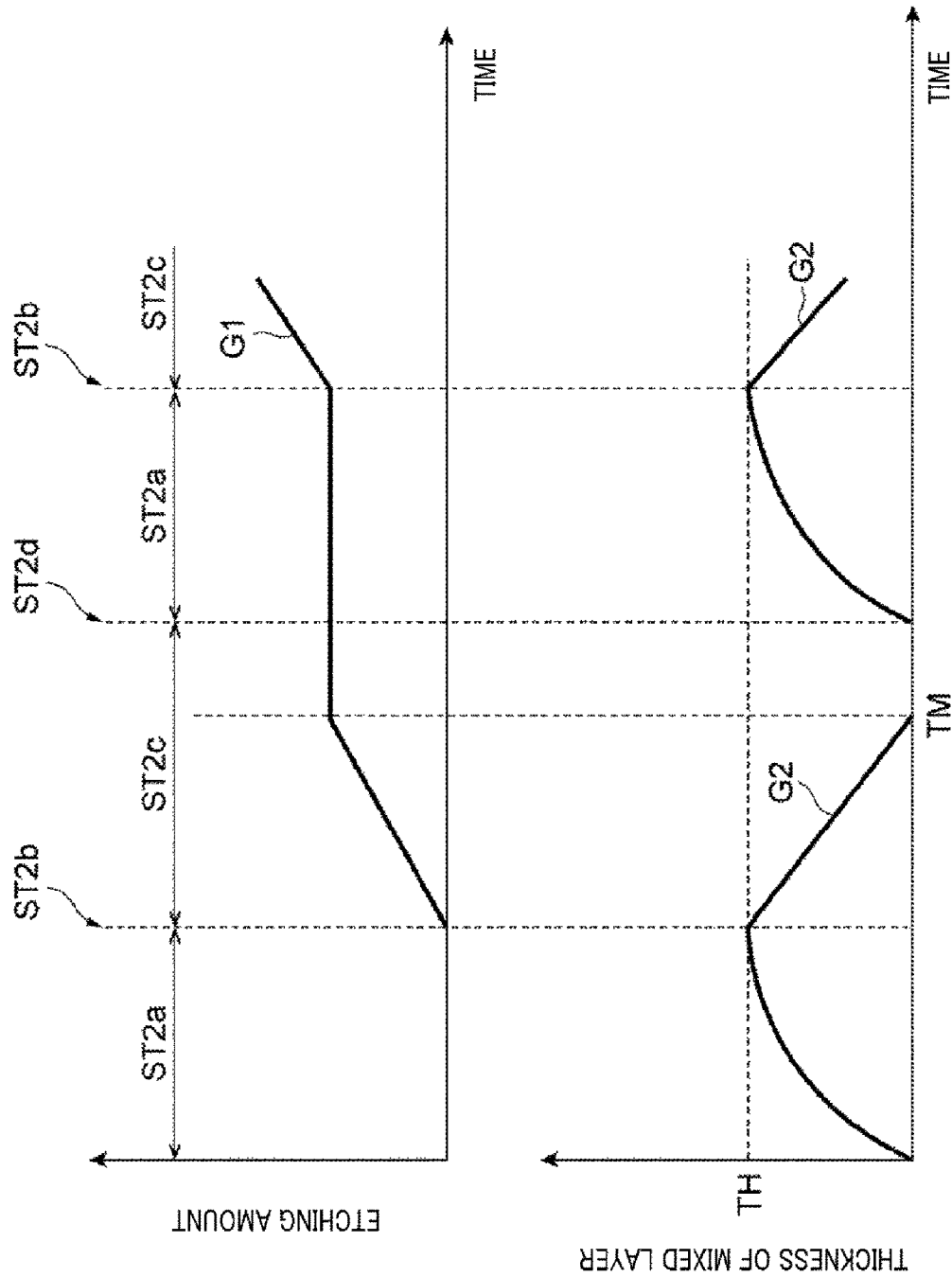
FIG. 4 is a diagram showing a variation of an etching amount upon an etching target layer and a variation of a thickness of a mixed layer formed in the etching target layer while the method shown in FIG. 1 is being performed.
Figure 5C:
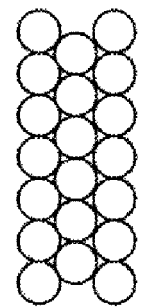
FIG. 5A to FIG. 5C are diagrams showing a principle of etching in the method shown in FIG. 1.
Figure 5B:
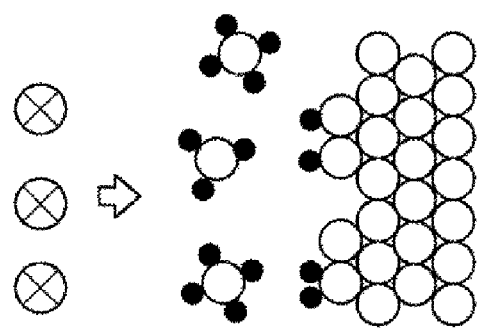
Figure 5A:
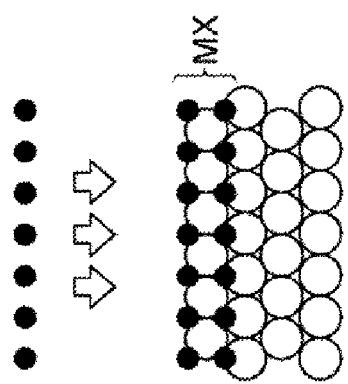

Referring back to FIG. 1, explanation of the method MT will be continued. In the following description, reference is made to FIG. 2, FIG. 3A to FIG. 3D, FIG. 4 and FIG. 5A to FIG. 5C as well as FIG. 1. FIG. 3A to FIG. 3D are cross sectional views illustrating an example of states of a processing target object before and after individual processes shown in FIG. 1 are performed. FIG. 4 is a diagram showing a variation of an etching amount of an etching target layer and a variation of a thickness of a mixed layer formed in the etching target layer while the method shown in FIG. 1 is being performed. FIG. 5A to FIG. 5C are diagrams showing a principle of etching in the method shown in FIG. 1.

The processing target object (wafer W) processed by the method MT has a first region and a second region in contact with the first region. The first region contains SiC (silicon carbide). The second region contains SiN (silicon nitride). In the following description of the exemplary embodiment, the wafer W processed by the method MT has a structure shown in FIG. 3A. However, the wafer W having another structure may be processed by the method MT. By way of non-limiting example, besides the structure shown in FIG. 3A, the wafer W processed by the method MT may have a structure to which SADP (Spacer Aligned Double Patterning) technique is applicable, a structure to which SAQP (Spacer Aligned Quadruple Patterning) technique is applicable, a structure to which a self-alignment technique is applicable, or the like. Any of these structures of the wafer W including the one to which the SADP technique is applicable has the first region containing the SiC and the second region containing the SiN, and the first region is a target of the etching by the method MT.

Figure 3A:
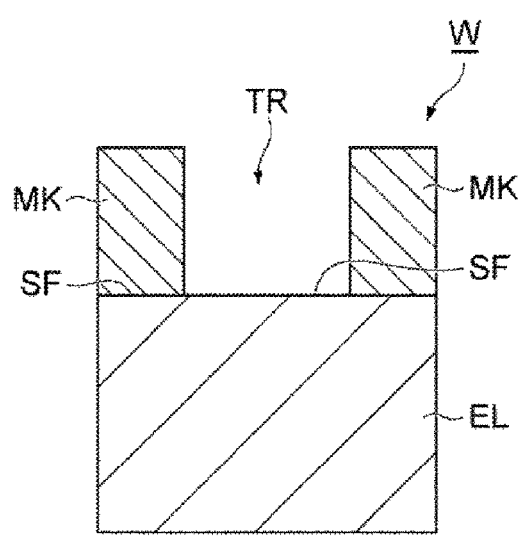
FIG. 3A to FIG. 3D are cross sectional views illustrating an example of states of a processing target object before and after individual processes shown in FIG. 1 are performed.

According to the exemplary embodiment, in a process ST1, the wafer W shown in FIG. 3A is prepared, and the wafer W is accommodated within the processing vessel 192 of the plasma processing apparatus 10 to be placed on the electrostatic chuck ESC. In the process ST1, after the aforementioned wafer W shown in FIG. 3A is prepared as the wafer W shown in FIG. 2, a sequence SQ and a process ST3 are respectively performed. In the present exemplary embodiment, the wafer W shown in FIG. 3A has a non-illustrated supporting base body, an etching target layer EL (first region) provided on this supporting base body, a mask MK (second region) provided on the etching target layer EL (a surface SF of the etching target layer EL), and an opening TR provided at the mask MK. The opening TR is provided in a surface of the mask MK. The mask MK has a hole reaching from the opening TR to the surface SF of the etching target layer EL. The opening TR allows the etching target layer EL to be exposed through the hole. That is, a part of the surface SF of the etching target layer EL (an exposed surface of the etching target layer EL) is exposed through the opening TR, and serves as an inner bottom surface of the opening TR. In the present exemplary embodiment, the etching target layer EL is made of a material containing SiC, and the mask MK is made of a material containing SiN.

The series of processes of the sequence SQ and the process ST3 following the process ST1 are processes of etching the etching target layer EL. First, following the process ST1, the sequence SQ1 is performed one (unit cycle) or more times. The sequence SQ is a series of processes of etching a region of the etching target layer EL, which is not covered with the mask MK, accurately with high selectivity regardless of denseness/sparseness of the mask MK through the same method as an ALE (Atomic Layer Etching) method. The sequence SQ includes a process ST2a (first process), a process ST2b (second process), a process ST2c (third process) and a process ST2d (fourth process) performed in sequence.

Figure 3B:
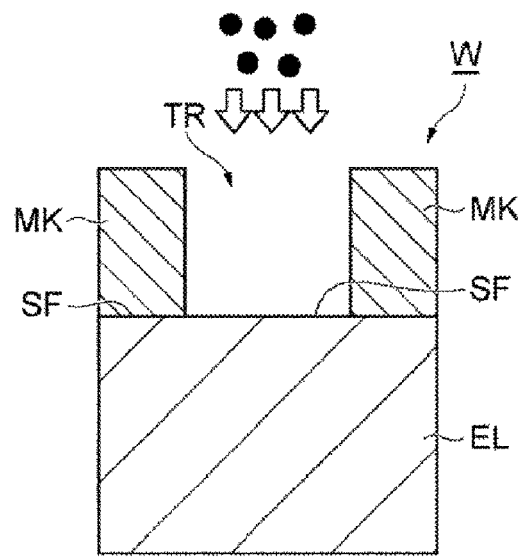

In the process ST2a, plasma of a first gas is generated (i.e., plasma is generated from a first gas) within the processing vessel 192 of the plasma processing apparatus 10 in which the wafer W is accommodated, and a mixed layer MX containing ions included in the plasma of the first gas (in the plasma generated from the first gas) is formed in an atomic layer of the surface SF (exposed surface) of the etching target layer EL via the opening TR. For example, in the process ST2a, by applying a bias voltage to the plasma of the first gas from the high frequency power supply 64, the mixed layer MX containing the ions included in the plasma of the first gas can be formed in the atomic layer of the surface SF of the etching target layer EL. In the process ST2a, by supplying the first gas into the processing vessel 192 in the state that the wafer W is placed on the electrostatic chuck ESC, the plasma of the first gas is generated as shown in FIG. 3B. In the present exemplary embodiment, the first gas contains nitrogen, specifically, a $N_2$ gas. Besides, the first gas may be a mixed gas containing a $N_2$ gas and an $O_2$ gas. In FIG. 3B, black-colored circles (black circles) indicate the ions (ions of nitrogen atoms) contained in the plasma of the first gas. To elaborate, the first gas containing the $N_2$ gas is supplied into the processing vessel 192 from a gas source selected from the gas sources belonging to the gas supply source 122. The high frequency powers are supplied from the high frequency power supply 150A and the high frequency power supply 150B, and the high frequency bias power is supplied from the high frequency power supply 64. Further, by operating the gas exhaust device 50, the internal pressure of the processing space Sp within the processing vessel 192 is set to a preset value. As a result, the plasma of the first gas is generated within the processing vessel 192, and the ions (ions of the nitrogen atoms) contained in the plasma of the first gas are attracted in the vertical direction by the high frequency bias power to be brought into contact with the surface SF of the etching target layer EL through the opening TR. As a result, the surface SF (exposed surface) of the etching target layer EL exposed through the opening TR is anisotropically modified. This anisotropically modified portion of the surface SF of the etching target layer EL in the process ST2a becomes the mixed layer MX.

FIG. 5A to FIG. 5C are diagrams showing the principle of the etching in the method (sequence SQ) shown in FIG. 1. In FIG. 5A to FIG. 5C, empty circles (white circles) represent atoms constituting the etching target layer EL (for example, atoms constituting SiC); black-colored circles (black circles) indicate the ions (ions of the nitrogen atoms) contained in the plasma of the first gas; and encircled 'X' marks indicate radicals included in plasma of a second gas to be described later. As depicted in FIG. 5A and FIG. 3B, through the process ST2a, the ions (black-colored circles (black circles)) of the nitrogen atoms included in the plasma of the first gas are anisotropically supplied to the atomic layer of the surface SF (exposed surface) of the etching target layer EL through the opening TR. Accordingly, through the process ST2a, the mixed layer MX containing the atoms constituting the etching target layer EL and the nitrogen atoms of the first gas is formed on the atomic layer of the surface SF (exposed surface) of the etching target layer EL exposed through the opening TR (see FIG. 3C as well as FIG. 5A).

As stated above, since the first gas contains the $N_2$ gas, the nitrogen atoms are supplied to the surface SF of the etching target layer EL in the process ST2a, so that the mixed layer MX can be formed on the atomic layer of the surface SF.

In the process ST2b following the process ST2a, the processing space Sp of the processing vessel 192 is purged. To elaborate, the first gas supplied in the process ST2a is exhausted. In the process ST2b, an inert gas such as a rare gas (e.g., an Ar gas or the like) may be supplied into the processing vessel 192 as a purge gas. That is, the purging of the process ST2b may be implemented by a gas purging of allowing the inert gas to flow in the processing vessel 192 or a purging by vacuum evacuation.

Figure 3C:
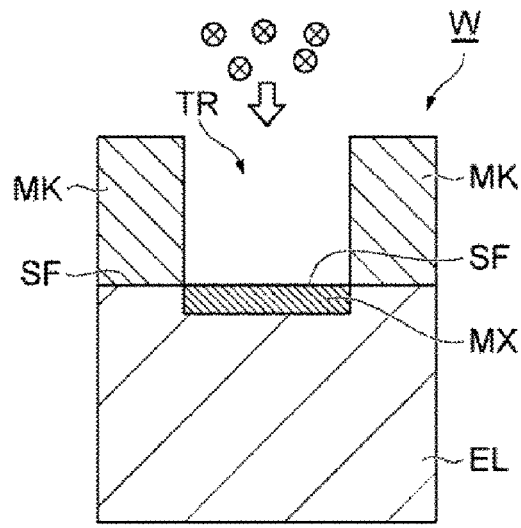

In the process ST2c following the process ST2b, the plasma of the second gas is generated (i.e., plasma is generated from the second gas) within the processing vessel 192, and the mixed layer MX is removed through chemical etching with the radicals included in this plasma. In the process ST2c, by supplying the second gas into the processing vessel 192 in the state that the wafer W having thereon the mixed layer MX formed in the process ST2a is placed on the electrostatic chuck ESC, the plasma of the second gas is generated, as illustrated in FIG. 3C. The plasma of the second gas generated in the process ST2c contains radicals configured to remove the mixed layer MX. The encircled 'X' marks in FIG. 3C indicate the radicals included in the plasma of the second gas. The second gas contains fluorine. By way of example, the second gas may be a mixed gas containing, but not limited to, a $NF_3$ gas and a $H_2$ gas. As a non-limiting example, the second gas may be a mixed gas containing a $NF_3$ gas, a $H_2$ gas, an $O_2$ gas and an Ar gas. To elaborate, the aforementioned second gas is supplied into the processing vessel 192 from a gas source selected from the gas sources belonging to the gas supply source 122, and the high frequency powers are supplied from the high frequency power supply 150A and the high frequency power supply 150B. By operating the gas exhaust device 50, the internal pressure of the processing space Sp of the processing vessel 192 is set to a predetermined pressure. As a result, the plasma of the second gas is generated in the processing vessel 192. The radicals in the plasma of the second gas generated in the process ST2c come into contact with the mixed layer MX on the surface SF of the etching target layer EL through the opening TR. As depicted in FIG. 5B, through the process ST2c, as the radicals of the atoms of the second gas are supplied onto the mixed layer MX formed in the surface SF of the etching target layer EL, the mixed layer MX is chemically etched to be removed from the etching target layer EL.

Figure 3D:
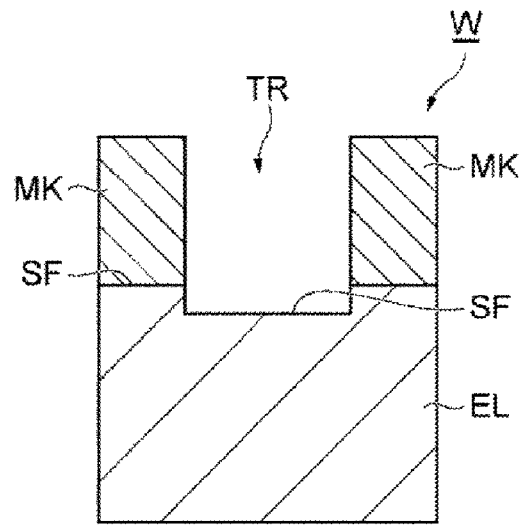

As stated above, as shown in FIG. 3D, in the process ST2c, the mixed layer MX formed in the surface SF of the etching target layer EL can be removed from the surface SF of the etching target layer EL by the radicals included in the plasma of the second gas.

In the process ST2d following the process ST2c, the processing space Sp within the processing vessel 192 is purged. To elaborate, the second gas supplied in the process ST2c is exhausted. In the process ST2d, an inert gas such as a rare gas (e.g., an Ar gas or the like) may be supplied into the processing vessel 192 as a purge gas. That is, the purging of the process ST2d may be implemented by the gas purging of allowing the inert gas to flow in the processing vessel 192 or the purging by vacuum evacuation.

In the process ST3 following the sequence SQ it is determined whether or not to finish the repetition of the sequence SQ. To elaborate, in the process ST3, it is determined whether the repetition number of the sequence SQ has reached a preset number. An etching amount upon the etching target layer EL (that is, a depth of a recess formed in the etching target layer EL by the etching) relies on the repetition number of the sequence SQ. The sequence SQ may be repeated such that the etching target layer EL is etched until the etching amount upon the etching target layer EL reaches a preset value. As the repetition number of the sequence SQ is increased, the etching amount upon the etching target layer EL is increased (in a substantially linear manner). Thus, the repetition number of the sequence SQ may be determined such that a product of a thickness of the etching target layer EL, which is etched by performing the sequence SQ a single time (unit cycle), (thickness of the mixed layer MX formed by performing the process ST2a single time) and the repetition number of the sequence SQ reaches a predetermined value.

Referring to FIG. 4, a variation of the etching amount upon the etching target layer EL and a variation of the thickness of the mixed layer MX formed on the etching target layer EL, which occur while the sequence SQ is being performed, will be explained. A graph G1 of FIG. 4 indicates the variation of the etching amount (arbitrary unit) upon the etching target layer EL which occurs when the sequence SQ is performed, and a graph G2 of FIG. 4 indicates the variation of the thickness (arbitrary unit) of the mixed layer MX formed on the etching target layer EL, which occurs when the sequence SQ is performed. A horizontal axis of FIG. 4 represents a time during the sequence SQ. However, a processing time of the process ST2b and a processing time of the process ST2d are omitted for the simplicity of illustration. As shown in FIG. 4, in performing the sequence SQ a single time (unit cycle), the process ST2a is performed until the thickness of the mixed layer MX reaches a preset value TH as shown in the graph G2. The thickness value TH of the mixed layer MX formed in the process ST2a may be determined by a value of the bias power applied from the high frequency power supply 64, a dose of the ions in the plasma of the first gas with respect to the etching target layer EL per unit time, and a processing time of the process ST2a.

Further, as shown in FIG. 4, in performing the sequence SQ the single time (unit cycle), the process ST2c is performed until the mixed layer MX formed in the process ST2a is completely removed, as indicated by the graph G1 and the graph G2. The mixed layer MX is completely removed through the chemical etching by a timing TM while performing the process ST2c. The timing TM may be determined by an etching rate of the chemical etching performed in the process ST2c. Advent of the timing TM occurs while the process ST2c is being performed. During a time period from the timing TM to an end of the process ST2c, the etching target layer EL after the mixed layer MX is removed is not etched by the plasma of the second gas (self-limited). That is, when using the radicals contained in the plasma of the second gas, the etching rate of the etching upon the etching target layer EL is very small as compared to the etching rate of the etching upon the mixed layer MX.

If it is determined in the process ST3 that the repetition number of the sequence SQ has not reached the preset number (process ST3: NO), the sequence SQ is repeated. If, on the other hand, it is determined in the process ST3 that the repetition number of the sequence SQ has reached the preset number (process ST3: YES), the repetition of the sequence SQ is ended. Through the series of processes of the sequence SQ and the process ST3, as the sequence SQ is repeated by using the mask MK, the etching target layer EL is removed atomic layer by atomic layer, so that the etching target layer EL is accurately etched regardless of the denseness/sparseness of the pattern of the mask MK or the degree (value) of the width of the opening TR. That is, as the sequence SQ is repeated the predetermined number of times, the etching target layer EL is precisely etched in the same width as the width of the opening TR of the mask MK in an uniform manner regardless of the denseness/sparseness of the pattern of the mask MK or the degree (value) of the width of the opening TR, and, also, the selectivity against the mask MK is improved. As stated above, through the series of processes of the sequence SQ and the process ST3, the etching target layer EL can be removed atomic layer by atomic layer with the same method as the ALE method.

Now, examples of major processing conditions for the process ST2a and the process ST2c will be specified.

Figure 6:
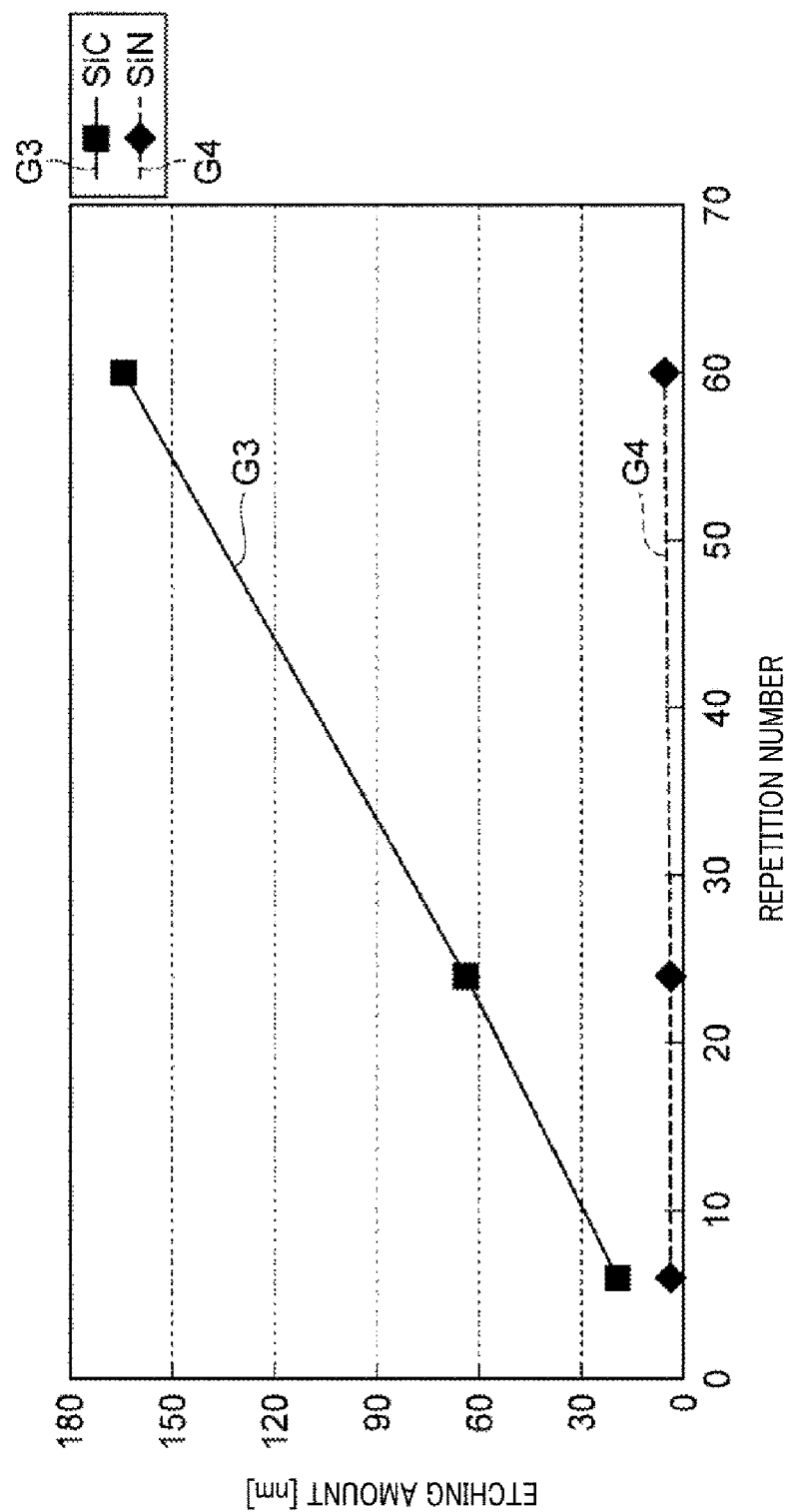
FIG. 6 is a diagram illustrating an example of a result obtained by performing the method shown in FIG. 1.

Regarding the processing conditions for <Process ST2a>
Internal pressure (mTorr) of the processing vessel 192: 30 mTorr
Value (W) of the high frequency powers from the high frequency power supplies 150A and 150B: 0 W (having a frequency of 27 MHz)
Value (W) of the high frequency power from the high frequency power supply 64 (frequency (MHz)): 50 W (having a frequency of 13 MHz)
First gas: $N_2$ gas
Flow rate (sccm) of the first gas: 200 sccm
Substrate temperature (° C.): 60° C.
Processing time (s): 15 s
Regarding the processing conditions for <Process ST2c>
Internal pressure (mTorr) of the processing vessel 192: 400 mTorr
Value (W) of the high frequency powers from the high frequency power supplies 150A and 150B: 600 W (having a frequency of 27 MHz)
Value (W) of the high frequency power from the high frequency power supply 64 (frequency (MHz)): 0 W (having a frequency of 13 MHz)
Second gas: mixed gas containing $NF_3$ gas, $H_2$ gas, $O_2$ gas and Ar gas Flow rate (sccm) of the second gas: 10 sccm ($NF_3$ gas), 80 sccm ($H_2$ gas), 150 sccm ($O_2$ gas) and 410 sccm (Ar gas)
Substrate temperature (° C.): 60° C.
Processing time (s): 5 s
Regarding the processing conditions for <Sequence SQ>
Repetition number: 5 times to 60 times Under the processing conditions as specified above, a result shown in FIG. 6 is obtained. FIG. 6 is a diagram showing an example of the result obtained by performing the method shown in FIG. 1 upon each of a SiC layer (a layer made of the same material as the etching target layer EL according to the exemplary embodiment) and a SiN layer. A graph G3 of FIG. 6 is a result obtained by performing the method shown in FIG. 1 upon the SiC layer, and a graph G4 of FIG. 6 is a result obtained by performing the method shown in FIG. 1 upon the SiN layer. A horizontal axis of FIG. 6 represents the repetition number of the sequence SQ and a vertical axis of FIG. 6 represents the etching amount (nm) (thickness) removed by performing the method MT (the sequence SQ and the process ST3). As illustrated in FIG. 6, in any of the SiC layer and the SiN layer, the etching amount (nm) is increased as the repetition number of the sequence SQ is increased. An increment of the etching amount with respect to an increment of the repetition number of the sequence SQ is remarkably larger in the SiC layer (the layer made of the same material as the etching target layer EL according to the exemplary embodiment) as compared to the SiN layer. If each of the graphs G3 and G4 is fitted in a straight line, for example, a gradient of the graph G3 is conspicuously larger than a gradient of the graph G4. For this reason, though a value (selectivity) of the etching amount of the SiC layer/the etching amount of the SiN layer, for example, is about 23 when the repetition number of the sequence SQ is 24 times, this value is remarkably increased to about 32 when the repetition number of the sequence SQ is 60 times. Further, as a result of the research, the inventors have found out that an etching rate (nm/min) obtained when performing the method MT on the SiC layer is remarkably higher than an etching rate (nm/min) obtained when performing the method MT on a layer of another material such as the SiN layer, and is also much higher as compared to an etching rate (nm/min) obtained when only the etching of the process ST2c is performed on the SiC layer without performing the process ST2a. Accordingly, when etching the etching target layer EL made of SiC by the method MT, a sufficiently high selectivity can be achieved if the mask MK made of SiN is used.

Furthermore, the inventors have also found out, as a result of the aforementioned research, that a foreign substance may be generated on the surface of the etching target layer EL when a value of the flow rate (sccm) of the Ar gas/the flow rate (sccm) of the $O_2$ gas is below 410/150, and, thus, to avoid the generation of the foreign substance, it is desirable to set the flow rates (sccm) of the Ar gas and the $O_2$ gas in the process ST2c such that the value of the flow rate (sccm) of the Ar gas/the flow rate (sccm) of the $O_2$ gas is equal to or larger than 410/150. Particularly, in case that the etching target layer EL is SiC and the mask MK is SiN, the flow rate of the $O_2$ gas needs to be of a value required to reduce oxidation of the surface of the SiC sufficiently while increasing oxidation of the surface of the SiN sufficiently.

According to the above-described method MT, the first region containing the silicon carbide (SiC) (that is, the exposed surface of the etching target layer EL (a part of the surface SF exposed through the opening TR)) can be formed and confined by the second region as the second region containing the silicon nitride (SiN) is provided to be in contact with the first region. In the process ST2a of the sequence SQ performed repeatedly, the mixed layer MX containing the nitrogen ions is formed on the exposed surface of the first region containing the silicon carbide by the plasma of the first gas containing the nitrogen. Then, in the process ST2c of the sequence SQ, the mixed layer MX formed through the process ST2a is removed by using the radicals contained in the plasma of the fluorine-containing second gas, while the etching upon the second region containing the silicon nitride is sufficiently suppressed. As stated, the mixed layer MX is formed to conform to the plane shape of the exposed surface of the first region (the shape of the opening TR) in the process ST2a using the first gas containing the nitrogen, and only the mixed layer MX is removed from the first region in the process ST2c using the second gas containing the fluorine. Accordingly, the etching upon the first region is enabled in the state that the plane shape of the exposed surface of the first region is maintained precisely while avoiding the etching on the second region and the formation of the deposit on the side surface (opening or sidewall of the mask MK) of the second region (mask MK) located above the exposed surface of the first region.

Thus, regardless of the plane shape of the exposed surface of the first region, the etching upon the first region can be performed in a uniform manner. Further, as the sequence SQ including these processes ST2a and ST2c is repeated, the etching upon the first region can be performed up to a required depth in a uniform manner regardless of the plane shape of the exposed surface of the first region, in the stat that the plane shape of the exposed surface of the first region is precisely maintained. In addition, since neither the first gas nor the second gas is a $Cl_2$-based gas or a HBr-based gas, the corrosion of the metal portion can be avoided.

If the bias voltage is applied to the plasma of the first gas, the ions (ions of the nitrogen atoms) contained in the corresponding plasma may be anisotropically supplied to the first region (the exposed surface of the etching target layer EL (a part of the surface SF exposed through the opening TR)). Therefore, the mixed layer MX formed on the exposed surface of the first region may have a shape highly conforming to the plane shape of the exposed surface of the first region (the shape of the opening TR), when viewed from above the exposed surface of the first region.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

The method MT can be performed even in case that the etching target layer EL is made of another material (e.g., SiN or the like) and in case that the mask MK is made of another material (e.g., another material containing Si). However, depending on the materials of the etching target layer EL and the mask MK, processing conditions including the selection of the first gas kind and the second gas kind need to be adjusted in a desirable way (see, for example, exemplary embodiments to be described below).

Another Exemplary Embodiment

In a method MT according to another exemplary embodiment, when the material of the etching target layer EL (first region) is SiC, the material of the second region may not be limited to SiN. By way of example, at least one of Ti, TiN, $TiO_x$, W, WC, Ru, Hf, $HfO_x$, Zr, $ZrO_x$, Ta, $SiO_2$, Si, SiGe and Ge may be used (x is a number equal to or larger than 1, the same as in the following description).

The first gas used to form the mixed layer MX on the atomic layer of the surface SF of the etching target layer EL may contain a gas having N (nitrogen), specifically, at least one of a $N_2$ gas, a $NH_3$ gas, a NO gas and a $NO_2$ gas. In addition to this N-containing gas, the first gas may further contain at least one of O (oxygen)-containing gases such as an $O_2$ gas, a $CO_2$ gas, a CO gas, a NO gas and a $NO_2$ gas.

The second gas used to remove the mixed layer MX may contain a F (fluorine)-containing gas, specifically, at least one of a $NF_3$ gas, a $SF_6$ gas and a $CF_4$ gas. The second gas may also contain at least one of a $H_2$ gas, a $D_2$ gas, a $NH_3$ gas and an O-containing gas (e.g., an $O_2$ gas, a $CO_2$ gas, a CO gas, a NO gas, a $NO_2$ gas, etc.).

The plasma source may be of any type as long as ion energy in a downward direction is relatively low. By way of non-limiting example, ICP, ECR (Electron Cyclotron Resonance) plasma, ion trapping configuration, plasma generated by using RLSA (Radial Line Slot Antenna), or the like may be used.

The O-containing gas may be added to either or both of the first gas and the second gas. A timing at which the O-containing gas is added may be a part of a first gas supply period and a second gas supply period.

Further, in case that the material of the mask MK contains Ru, the O-containing gas is not added. The O-containing gas may be added prior to performing the process ST2c of removing the mixed layer MX with the second gas.

Figure 7:
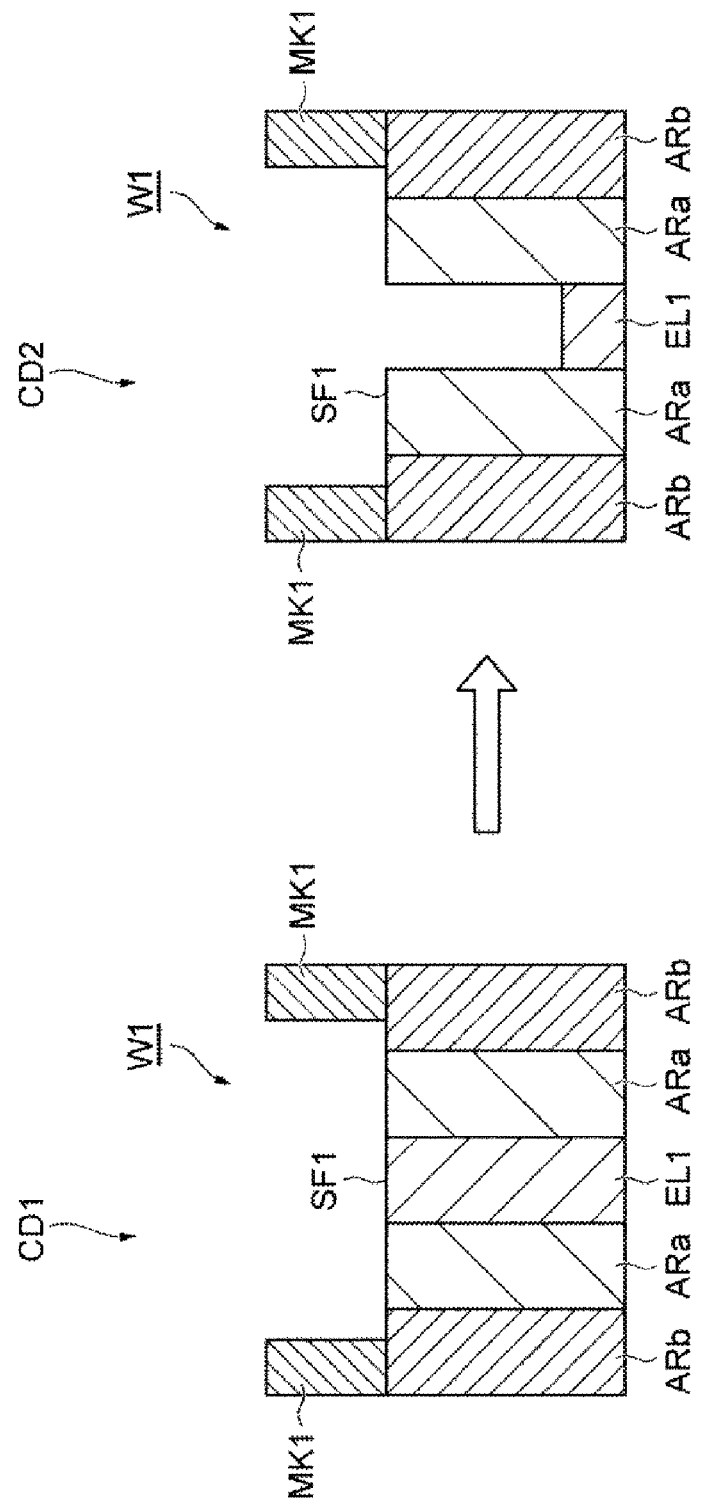
FIG. 7 is a diagram for describing a case where a method according to another exemplary embodiment is applied to another type of processing target object.

Furthermore, the method MT is also applicable to etching an etching target layer EL1 (first region) on a wafer W1 shown in FIG. 7. The etching target layer EL1 corresponds to the etching target layer EL of the wafer W shown in FIG. 3A to FIG. 3D. The wafer W1 illustrated in FIG. 7 has the etching target layer EL1, a region ARa (second region), and a region ARb (second region). The etching target layer EL1, the region ARa and the region ARb are formed along a surface SF1 of the wafer W1. The etching target layer EL1, the region ARa and the region ARb are exposed on the surface SF1. A mask MK1 (second region) is provided on the region ARb.

A material of the etching target layer EL1 includes SiC. A material of the ARa and a material of the ARb include, by way of example, Si, SiN, $SiO_2$, a metal or an organic material. A material of the mask MK1 includes, by way of non-limiting example, an organic material or $SiO_2$. The wafer W1 having this structure is turned from a state CD1 before the etching into a state CD2 after the etching, i.e., after the etching of the method MT is performed. In the method MT, the sequence SQ including the process ST2a of forming the nitrogen-containing layer (corresponding to the mixed layer MX shown in FIG. 3C) on the surface of the etching target layer EL1 and the process ST2c of removing the nitrogen-containing layer is repeated. Accordingly, on the wafer W1 in the state CD1, only the etching target layer EL1 is selectively etched, so that the wafer W1 in the state CD2 is obtained. In the process ST2a, the high frequency bias power may be applied. In the process ST2c, on the other hand, the high frequency bias power may not be applied. If the high frequency bias power is not applied in the process ST2c, the etching selectivity can be improved.

Still Another Exemplary Embodiment

There is also a demand for a technique capable of improving the selectivity in a desirable manner when etching a processing target object containing silicon oxide. A method MT according to still another exemplary embodiment is directed to selectively etching the etching target layer EL (first region) having $SiO_2$. In this method MT, at least one of, but not limited to, Ti, TiN, $TiO_x$, W, WC, Ru, Hf, $HfO_x$, Zr, $ZrO_x$ and Ta may be used as the material of the second region.

The first gas used to form the mixed layer MX on the atomic layer in the surface SF of the etching target layer EL may contain a N-containing gas, specifically, at least one of a $N_2$ gas, a $NH_3$ gas, a NO gas and a $NO_2$ gas. In addition to this N-containing gas, the first gas may further contain at least one of O-containing gases such as an $O_2$ gas, a $CO_2$ gas, a CO gas, a NO gas and a $NO_2$ gas.

The second gas used to remove the mixed layer MX may contain a F-containing gas, specifically, at least one of a $NF_3$ gas, a $SF_6$ gas and a $CF_4$ gas. The second gas may also contain at least one of a $H_2$ gas, a $D_2$ gas, a $NH_3$ gas and an O-containing gas (e.g., an $O_2$ gas, a $CO_2$ gas, a CO gas, a NO gas, a $NO_2$ gas, etc.).

The plasma source may be of any type as long as ion energy in a downward direction is relatively low. By way of non-limiting example, ICP, ECR plasma, ion trapping configuration, RLSA, or the like may be used.

The O-containing gas may be added to either or both of the first gas and the second gas. A timing at which the O-containing gas is added may be a part of the first gas supply period and the second gas supply period.

Further, in case that the material of the mask MK contains Ru, the O-containing gas is not added. The O-containing gas may be added prior to performing the process ST2c of removing the mixed layer MX with the second gas.

Furthermore, in the method MT (see FIG. 1) according to the above-described various exemplary embodiments, in the process ST1, the processing target object (e.g., the wafer W, the wafer W1) having the etching target layer containing the first material (e.g., the etching target layer EL, the etching target layer EL1) and the region (e.g., the mask MK, the region ARa, the region ARb, the mask MK1) containing a material different from that of the etching target layer are prepared. Further, in the process ST2a of this method MT, by exposing the processing target object to the nitrogen plasma, the nitrogen-containing layer (e.g., the mixed layer MX) is formed on the etching target layer. In the process ST2c, by exposing the processing target object to the fluorine plasma after the process ST2a of forming the nitrogen-containing layer, the nitrogen-containing layer is removed. Furthermore, in this method MT, the etching target layer is removed by repeating the process ST2a and the process ST2c. In the process ST2a, the high frequency bias power may be applied. In the process ST2c, on the other hand, the high frequency bias power may not be applied. If the high frequency bias power is not applied in the process ST2c, the etching selectivity can be improved.

We claim:

1. An etching method of etching a processing target object having a first region and a second region, the etching method comprising:
   etching the first region as an etching target layer to remove the first region in an atomic layer by using the second region as a mask and by repeating a sequence comprising:
   a first process of generating first plasma from a first gas within a processing vessel of a plasma processing apparatus in which the processing target object is accommodated to form a mixed layer containing ions contained in the first plasma in an atomic layer of an exposed surface of the first region;
   a second process of purging a space within the processing vessel after performing the first process;
   after performing the second process, a third process of generating second plasma from a second gas within the processing vessel to remove the mixed layer by radicals contained in the second plasma; and
   a fourth process of purging the space within the processing vessel after performing the third process,
   wherein the first region contains silicon carbide,
   the second region contains silicon nitride,
   the first gas contains nitrogen, and
   the second gas contains fluorine.

2. The etching method of claim 1,
   wherein, in the first process, the mixed layer containing the ions is formed in the atomic layer of the exposed surface of the first region by applying a bias voltage to the plasma generated from the first gas.

3. The etching method of claim 1,
   wherein the first gas is a $N_2$ gas or a mixed gas containing a $N_2$ gas and an $O_2$ gas.

4. The etching method of claim 1,
   wherein the second gas is a mixed gas containing a $NF_3$ gas, a $H_2$ gas, an $O_2$ gas and an Ar gas.

5. The etching method of claim 1, further comprising:
   determining whether a repetition number of the sequence reaches a preset number.

6. The etching method of claim 5,
   wherein the preset number is determined based on an etching amount of the first region.

7. The etching method of claim 5,
   wherein the preset number is determined such that a product of an etching thickness of the first region, which is removed by performing the sequence a single time, and the preset number reaches a predetermined value.

8. An etching method of etching a processing target object within a processing vessel, the processing target object having a first region containing SiC and a second region containing Ti, TiN, $TiO_x$, W, WC, Hf, $HfO_x$, Zr, $ZrO_x$, Ta, $SiO_2$, Si, SiGe, Ge, or Ru (x is an integer), the etching method comprising:
   removing the first region as an etching target layer by using the second region as a mask and by repeating a sequence comprising:
   forming, by generating first plasma from a first gas containing nitrogen, a mixed layer containing ions contained in the first plasma in the first region; and
   removing the mixed layer by generating second plasma from a second gas containing fluorine within the processing vessel after the forming of the mixed layer.

9. The etching method of claim 8, further comprising:
   purging a space within the processing vessel between the forming of the mixed layer and the removing of the mixed layer or after the removing of the mixed layer.

10. The etching method of claim 8,
    wherein the first gas contains at least one of a $N_2$ gas, a $NH_3$ gas, a NO gas and a $NO_2$ gas, and
    the second gas contains at least one of a $NF_3$ gas, a $SF_6$ gas and a $CF_4$ gas.

11. The etching method of claim 10,
    wherein the first gas further contains at least one of an $O_2$ gas, a $CO_2$ gas, a CO gas, a NO gas and a $NO_2$ gas.

12. The etching method of claim 11,
    wherein the second gas further contains at least one of a $H_2$ gas, a $D_2$ gas, a $NH_3$ gas, an $O_2$ gas, a $CO_2$ gas, a CO gas, a NO gas and a $NO_2$ gas.

13. An etching method, comprising:
    preparing a processing target object having a first region as an etching target layer made of a first material containing silicon carbide and a second region as a mask containing containing silicon nitride;
    forming a layer containing nitrogen in the first region by exposing the processing target object to nitrogen plasma; and
    after the forming of the layer, removing the layer by exposing the processing target object to fluorine plasma,
    wherein the first region is removed by using the second region as a mask and by repeating the forming of the layer and the removing of the layer.

* * * * *

UNITED STATES PATENT AND TRADEMARK OFFICE
CERTIFICATE OF CORRECTION

PATENT NO. : 10,483,118 B2  
APPLICATION NO. : 15/975852  
DATED : November 19, 2019  
INVENTOR(S) : Sho Kumakura et al.

Page 1 of 1

It is certified that error appears in the above-identified patent and that said Letters Patent is hereby corrected as shown below:

In the Specification

Column 13, Line 26, "1506" should be -- 150B --.

Signed and Sealed this  
Eighteenth Day of February, 2020

Andrei Iancu  
*Director of the United States Patent and Trademark Office*